United States Patent
Shibazaki

(10) Patent No.: US 7,697,222 B2
(45) Date of Patent: Apr. 13, 2010

(54) APPARATUS FOR HOLDING OPTICAL ELEMENT, BARREL, EXPOSURE APPARATUS, AND DEVICE PRODUCING METHOD

(75) Inventor: Yuichi Shibazaki, Kumagaya (JP)

(73) Assignee: Nikon Corporation, Tokyo (JP)

(*) Notice: Subject to any disclaimer, the term of this patent is extended or adjusted under 35 U.S.C. 154(b) by 154 days.

(21) Appl. No.: 10/584,177

(22) PCT Filed: Dec. 22, 2004

(86) PCT No.: PCT/JP2004/019265

§ 371 (c)(1), (2), (4) Date: Jun. 23, 2006

(87) PCT Pub. No.: WO2005/064382

PCT Pub. Date: Jul. 14, 2005

(65) Prior Publication Data

US 2007/0183064 A1  Aug. 9, 2007

(30) Foreign Application Priority Data

Dec. 25, 2003  (JP) ............................ 2003-431484

(51) Int. Cl.
G02B 7/02 (2006.01)
(52) U.S. Cl. ...................... 359/822; 359/823
(58) Field of Classification Search .............. 359/822, 359/823
See application file for complete search history.

(56) References Cited

U.S. PATENT DOCUMENTS

| | | |
|---|---|---|
| 5,383,168 A | 1/1995 | O'Brian et al. |
| 5,822,133 A | 10/1998 | Mizuno et al. |
| 5,986,827 A | 11/1999 | Hale |
| 6,191,898 B1 | 2/2001 | Trunz et al. |
| 6,229,657 B1 | 5/2001 | Holderer et al. |
| 6,239,924 B1 | 5/2001 | Watson et al. |
| 6,257,957 B1 | 7/2001 | Murray et al. |
| 6,259,571 B1 | 7/2001 | Holderer et al. |
| 6,271,976 B1 | 8/2001 | Weber |
| 6,275,344 B1 | 8/2001 | Holderer |
| 6,307,688 B1 | 10/2001 | Merz et al. |

(Continued)

FOREIGN PATENT DOCUMENTS

EP  1137054  9/2001

(Continued)

OTHER PUBLICATIONS

"Notification of Transmittal of Copies of Translation of the International Preliminary Report on Patentability, International Preliminary Report on Patentability, and Written Opinion of the International Searching Authority" Aug. 31, 2006, pp. 1-6.

*Primary Examiner*—Jordan M. Schwartz
*Assistant Examiner*—James C Jones

(57) ABSTRACT

A holding apparatus (38) for holding an optical element (37) at a controlled position and attitude. The optical element (37) is held at an inner ring (43) by a piezo housing (54). A piezo element (65) is isolated from the optical element (37). When the piezo element (65) elongates and contracts, a displacement section (70) is displaced in a plane perpendicular to the optical axis of the optical element while being guided by a parallel link section (71). A transmission link section (72) converts the direction of the displacement of the optical element (37) to transmit the result to a part of the inner ring (43).

23 Claims, 8 Drawing Sheets

U.S. PATENT DOCUMENTS

| | | |
|---|---|---|
| 6,388,823 B1 | 5/2002 | Gaber et al. |
| 6,400,516 B1 | 6/2002 | Spinali |
| 6,552,862 B2 | 4/2003 | Dieker |
| 6,674,584 B2 | 1/2004 | Anderson |
| 6,734,949 B2 | 5/2004 | Franken |
| 6,853,443 B2 | 2/2005 | Nishi |
| 6,930,842 B2 | 8/2005 | Shibazaki |
| 7,035,056 B2 | 4/2006 | Franken et al. |
| 7,477,842 B2 | 1/2009 | Gutierrez |
| 2001/0038500 A1 | 11/2001 | Shibazaki |
| 2002/0085291 A1 | 7/2002 | Dieker |
| 2002/0163741 A1 | 11/2002 | Shibazaki |
| 2003/0189769 A1 | 10/2003 | Anderson |
| 2003/0234916 A1 | 12/2003 | Watson |
| 2004/0070852 A1* | 4/2004 | Omura et al. ............... 359/822 |
| 2006/0158749 A1 | 7/2006 | Sorg et al. |
| 2007/0279768 A1 | 12/2007 | Shibazaki |
| 2009/0103199 A1 | 4/2009 | Soemers et al. |

FOREIGN PATENT DOCUMENTS

| | | |
|---|---|---|
| JP | 10-186198 | 7/1998 |
| JP | 11-044834 | 2/1999 |
| JP | 2000235134 | 2/2000 |
| JP | 2001-343575 | 12/2001 |
| JP | 2002-131605 | 5/2002 |
| JP | 2002-134384 | 5/2002 |
| JP | 2002519843 | 7/2002 |
| JP | 2002107595 | 10/2002 |
| JP | 200329116 | 1/2003 |
| WO | 9967683 | 12/1999 |

* cited by examiner

APPARATUS FOR HOLDING OPTICAL ELEMENT, BARREL, EXPOSURE APPARATUS, AND DEVICE PRODUCING METHOD

BACKGROUND OF THE INVENTION

The present invention relates to an optical element holding device, and more particularly, to a holding device that enables highly accurate adjustment of the position of an optical element. The present invention provides a holding device, a barrel including the holding device, an exposure apparatus including the barrel, and a device manufacturing method including exposure performed with the exposure apparatus.

In the prior art, a plurality of optical elements that form a projection optical system of a projection exposure apparatus are held by holding devices, which enable accurate adjustment of the positions of the optical elements in the optical axis direction and the attitudes of the optical elements, such as tilt. The adjustment of the positions and the attitudes of the optical elements corrects aberrations and controls aberration fluctuations, which would be caused by changes in atmospheric pressure and absorption irradiated heat.

A holding device for adjusting the position of an optical element through automatic control has been disclosed (refer to patent publication 1). The holding device includes an inner ring for holding the peripheral edge of a lens, and an outer ring arranged outside the inner ring connected to the inner ring. The outer ring includes an actuator. Displacement of the actuator is transmitted to the inner ring by a displacement enlargement mechanism so as to displace the lens. A sensor is attached to the outer ring to monitor the position of the lens. A barrel including the holding device is relatively compact.

To enable the manufacturing of high-density and fine-pitch semiconductor devices, projection exposure apparatuses are required to perform exposure with higher resolutions. There is a tendency for projection exposure apparatuses to use exposure light with shorter wavelengths. For example, the projection exposure apparatuses may use ArF excimer lasers ($\lambda$=193 nm) or $F_2$ lasers ($\lambda$=157 nm). The use of exposure light with shorter wavelengths contributes to enhancing resolution.

When exposure light having a wavelength of 200 nm or shorter is used, the existence of absorption substances, such as water, oxygen, and organic substances, in the optical path of the exposure light, would greatly attenuate the intensity of the exposure light. In view of this, the holding device described in the patent publication 1 supplies purge gas into the barrel to remove water, oxygen, and organic substances, which that may be present in the optical path of the exposure light, from the barrel. However, a gap is formed between the outer ring and the actuator. The purge gas may leak from the gap or ambient air (gas including oxygen, water, and organic substances) may flow through the gap into the inner space of the barrel. Therefore, a jacket is arranged around the barrel, and the space surrounded by the jacket is filled with purge gas.

Patent Publication 1: U.S. Patent Publication No. 2001/0038500

The space surrounded by the jacket accommodates a signal communication coated cable, which is connected to the sensor, and a power feeding coated cable, which is connected to the actuator. The coated cables may generate a subtle amount of chemical pollutants (outgas), such as organic substances. The space surrounded by the jacket is connected to the inner space of the barrel through the gap described above. The subtle amount of chemical pollutants generated by the coated cables may flow from the space surrounded by the jacket into the inner space of the barrel through the gap described above, and may absorb the exposure light or cause loss of transparency of the lenses accommodated in the barrel.

BRIEF SUMMARY OF THE INVENTION

The present invention provides an optical element holding device that enables adjustment of the position and attitude of an optical element without disturbing the purge atmosphere formed interior of a barrel.

To achieve the above object, one aspect of the present invention provides an optical element holding device including a frame member. A holding member, arranged in the frame member, holds the optical element. A displacement portion is displaced in a direction intersecting with an optical axis of the optical element by a driving force applied from outside the frame member. A transmission portion transmits displacement of the displacement portion to the holding member. The transmission portion displaces the holding member in a direction substantially parallel to the optical axis of the optical element. Since drive sources that may generate chemical pollutants are arranged outside the frame member, the influence of chemical pollutants on the optical element is reduced.

In one embodiment, the displacement portion is displaced within a plane that is orthogonal to the optical axis of the optical element. This reduces the dimension (thickness) of the optical element holding device along the optical axis of the optical element. Further, since the driving force is applied within the plane orthogonal to the optical axis of the optical element, the driving force does not cause the frame member to be distorted along the optical axis of the optical element.

One embodiment further includes a driving member; attached to the frame member and configured to generate the driving force, wherein the driving member urges the displacement portion in a direction intersecting with the optical axis of the optical element. In this case, since the driving member is mounted on the frame member, the internal structure of the frame member is simple.

In one embodiment, the driving member includes a driving element and a housing; connected to the displacement portion and configured to accommodate the driving element. The housing includes a coupling portion configured to transmit a driving force generated by the driving element to the displacement portion. In this case, the driving force applied from the outside of the frame member is transmitted to the displacement portion via the housing.

In one embodiment, the driving member includes a rough adjustment mechanism that roughly adjusts the position of the holding member, and a fine movement mechanism that finely adjusts the position of the holding member. This structure enables rough adjustment and fine adjustment of the position of the displacement portion to be performed accurately and quickly.

In one embodiment, the fine movement mechanism includes a piezoelectric element. The piezoelectric element is easily controlled, has a quick response, and generates a strong and stable driving force. Thus, the piezoelectric element is suitable for use in adjusting the attitude of the optical element.

One embodiment further includes a guiding portion configured to guide the displacement portion in a manner that the displacement portion is displaced in a limited direction. This structure enables the holding member that holds the optical element to move accurately.

One embodiment further includes an urging member; arranged between the displacement portion and the frame member configured to urge the displacement portion toward the frame member. This structure enables the attitude of the optical element to be controlled in a manner accurately following the displacement of the displacement portion.

In one embodiment, the transmission portion is a rod having one end, connected to the holding member in a manner rotatable and tiltable in any direction, and another end, connected to the displacement portion in a manner rotatable and tiltable in any direction. The one end and the other end of the rod are connected by an axis tilted relative to a direction in which the displacement portion is displaced. This structure enables part of the holding member to be moved parallel to the optical axis of the optical element by displacing the displacement portion within the plane orthogonal to the optical axis of the optical element.

In one embodiment, the displacement portion is one of three displacement portions that are arranged on the frame member, and the transmission portion is one of three transmission portions associated with the displacement portions, with each transmission portion including two rods connected to the associated displacement portion. This structure enables the optical element to be kinematically supported.

One embodiment further includes a vibration attenuating mechanism; arranged between the frame member and the displacement portion configured to attenuate vibration of the displacement portion generated by the driving force. In this case, the attitude of the optical element is adjusted appropriately without the transmission portion and the holding member receiving stress.

In one embodiment, the vibration attenuating mechanism includes a friction member fixed to one of the frame member and the displacement portion and slidably contacting the other one of the frame member and the displacement portion. In this case, the simple structure effectively attenuates vibrations.

In one embodiment, at least two of the frame member, the displacement portion, the guide portion, and the transmission portion are monolithically formed as a single structure body. For example, the single structure body is formed through engraving machining and includes a connecting portion connecting the at least two of the frame member, the displacement portion, the guide portion, and the transmission portion to one another. The plurality of components are formed integrally. As a result, the number of components decreases, the structure becomes simple, the relative positions of parts are accurately determined, unnecessary stress is not generated, and the rigidity of the structure becomes high.

One embodiment further includes a displacement detection mechanism having a detector arranged inside the frame member configured to detect displacement of the holding member, and a monitoring portion arranged outside the frame member configured to monitor a detection result of the detector from outside the frame member. The monitoring portion enables the detection result to be read while maintaining the hermetic state of the frame member. In this case, the displacement of the holding member may be understood without disturbing the purge atmosphere inside a barrel.

One embodiment further includes a seal configured to isolate an inner space of the frame member from the outer side of the frame member and hermetically sealing the inner space of the frame member. In this case, the holding device maintains a high-level purge atmosphere formed inside a barrel without particularly using a cover for covering the barrel.

The holding device may be incorporated in a barrel. The barrel solely achieves a high-level purge atmosphere. The barrel may include, for example, a projection optical system for projecting an image of a predetermined pattern formed on a mask onto a substrate. The barrel may be incorporated in an exposure apparatus. The exposure apparatus accurately corrects aberrations and is thus suitable for use in a lithography process included in the manufacturing processes of precision devices. The exposure apparatus enables high-quality devices to be manufactured.

DETAILED DESCRIPTION OF THE PREFERRED EMBODIMENTS

Figure 1:
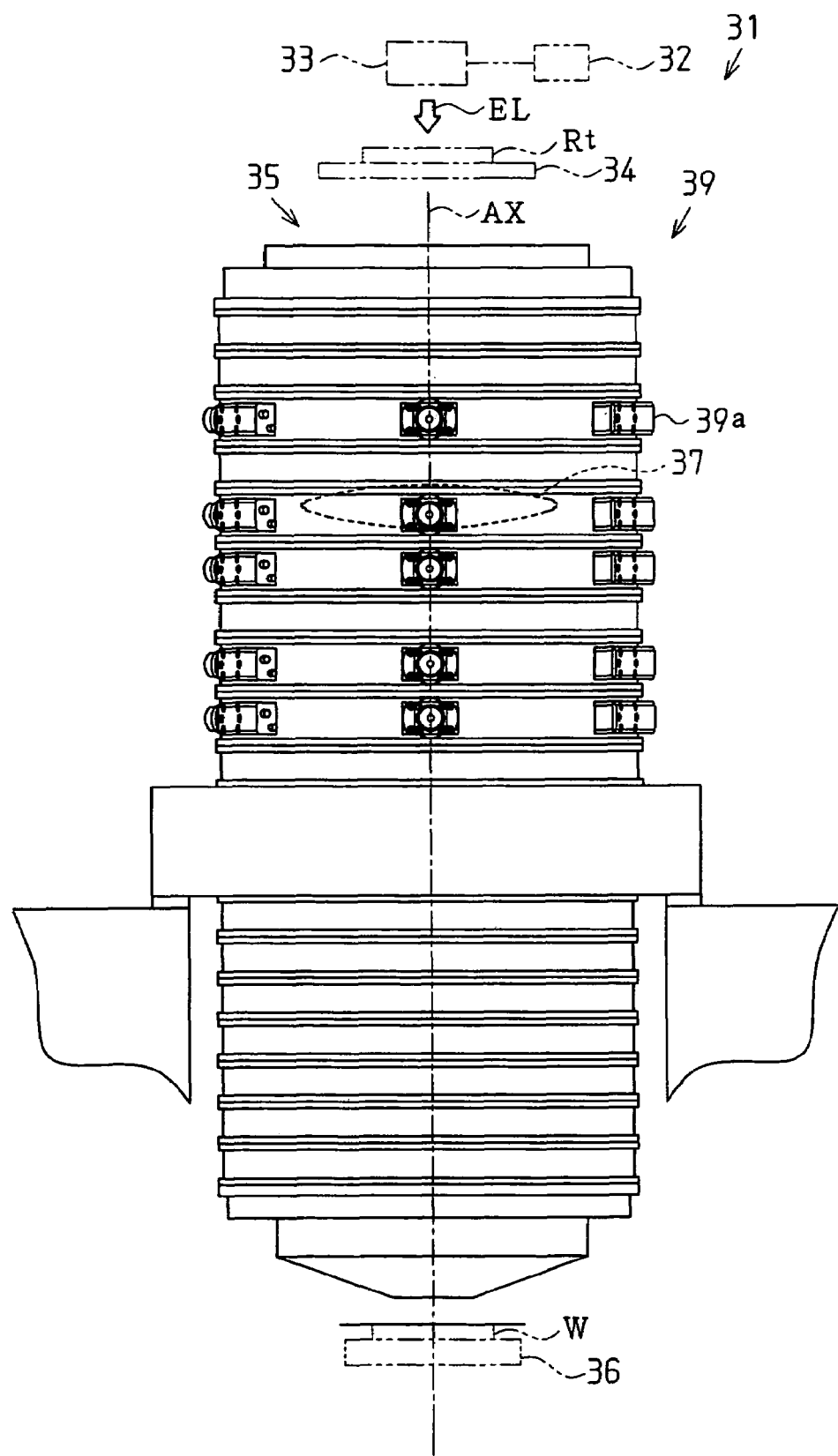
FIG. 1 is a schematic diagram of an exposure apparatus including an optical element holding device according to a preferred embodiment of the present invention.

An optical element holding device according to a preferred embodiment of the present invention will now be described. First, an exposure apparatus 31 will be briefly described with reference to FIG. 1. The exposure apparatus 31 includes a light source 32, an illumination optical system 33, a reticle stage 34 holding a reticle Rt serving as a mask, a projection optical system 35, and a wafer stage 36 holding a wafer W serving as a substrate.

The light source 32 oscillates, for example, $F_2$ laser light having a wavelength of 157 nm. Alternatively, the light source 32 may oscillate KrF excimer laser light having a wavelength of 248 nm or ArF excimer laser light having a wavelength of 193 nm. The present invention is advantageous when applied to the exposure apparatus 31 using light having relatively short wavelengths, such as $F_2$ laser light, ArF excimer laser light, and extreme ultraviolet (EUV) light having a wavelength of 13 nm.

The illumination optical system 33 includes various lens systems including optical integrators, such as a fly-eye lens and a rod lens, a relay lens and a condenser lens, and an aperture stop, which are not shown in the drawings. Laser light emitted from the light source 32 passes through the illumination optical system 33 so that the light is adjusted to be exposure light EL, which uniformly illuminates a pattern on the reticle Rt.

The reticle stage 34 has a placement surface on which the reticle Rt is placed. The reticle stage 34 is arranged in a manner that its placement surface is substantially perpendicular to the optical axis of the projection optical system 35 at the light emitting side of the illumination optical system 33, that is, the object surface side of the projection optical system 35 (incident side of the exposure light EL).

The projection optical system 35 includes optical elements 37, such as lenses. The projection optical system 35 is accommodated in a barrel 39, which is assembled by stacking a plurality of barrel modules 39a. Each barrel module 39a holds one or two optical elements 37.

Some (five in FIG. 1) of the plurality of barrel modules 39a include holding devices 38 for holding the optical elements 37. The other barrel modules 39a may also include the holding devices 38 or holding devices that differ in structure from the holding devices 38.

The wafer stage 36 has a placement surface on which the wafer W is placed. The placement surface of the wafer stage 36 is arranged to intersect with the optical axis direction of the projection optical system 35 at the image forming side of the projection optical system 35 (the side at which the exposure light EL is emitted). An image of the pattern on the reticle Rt illuminated with the exposure light EL is reduced by a predetermined reduction magnification by the projection optical system 35. Then, the image is projected and transferred onto the wafer W placed on the wafer stage 36.

Figure 2:
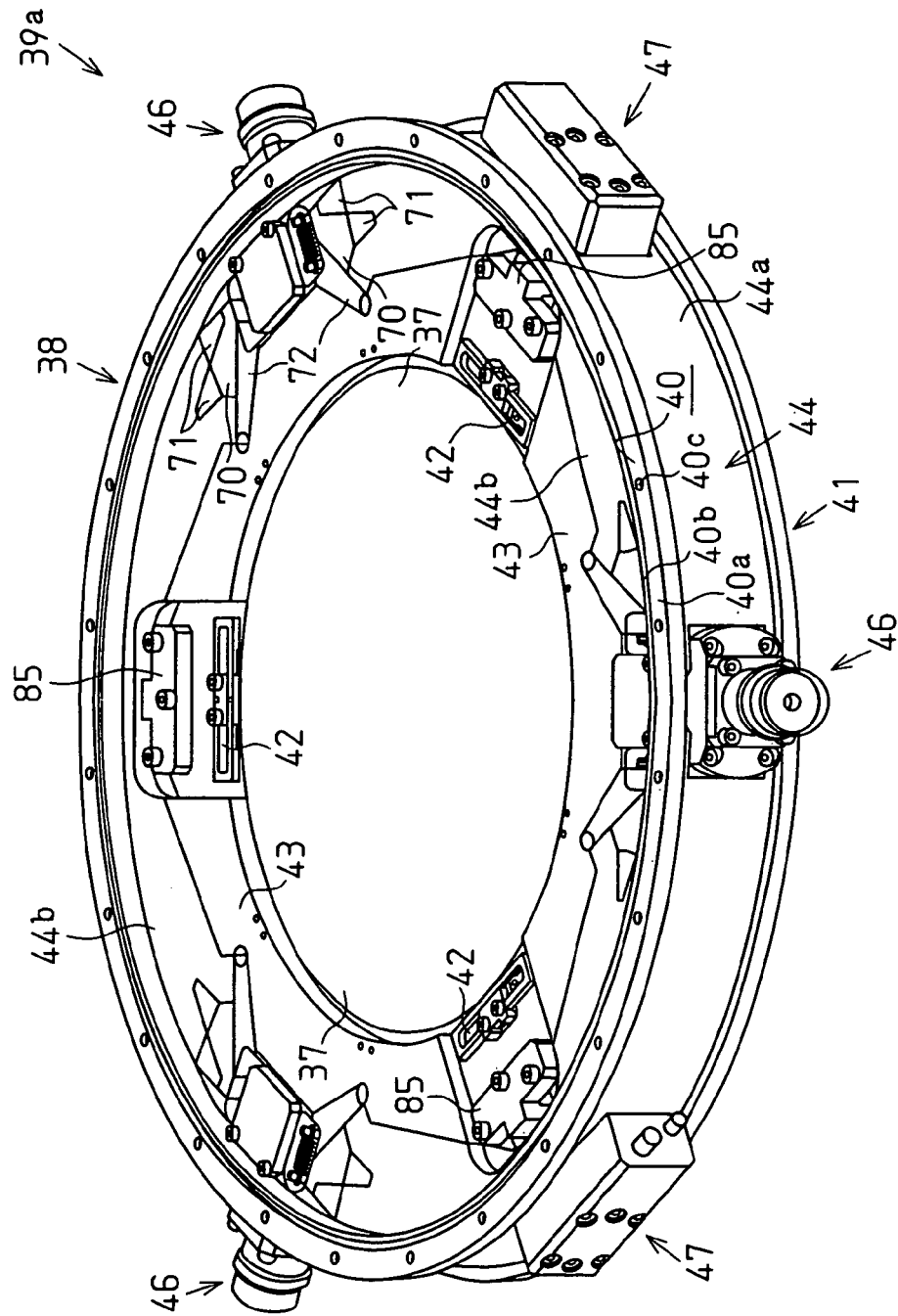
FIG. 2 is a perspective view showing the optical element holding device.
Figure 3:
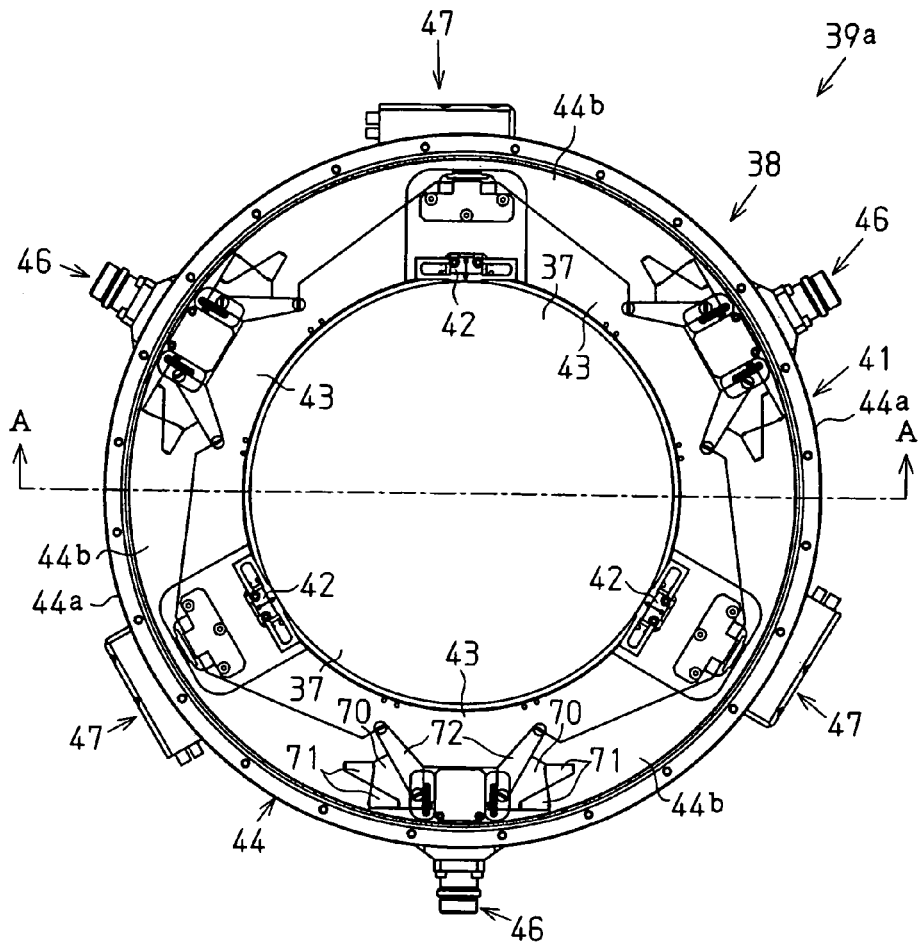
FIG. 3 is a plan view showing the optical element holding device.
Figure 4:
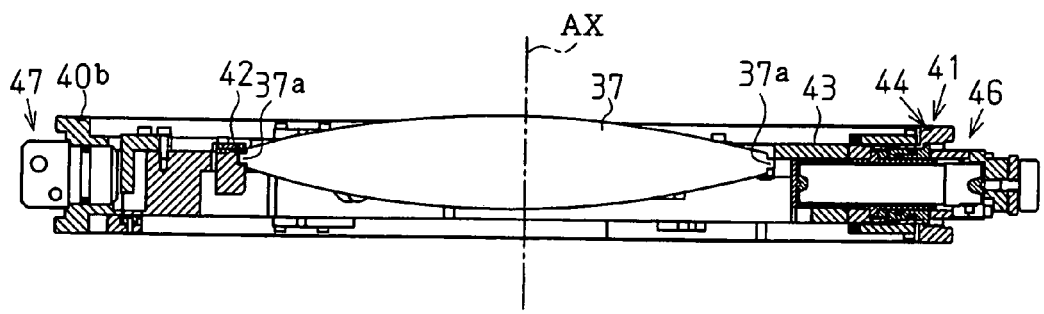
FIG. 4 is a cross-sectional view taken along line A-A in FIG. 3.

The holding device 38 will now be described. FIG. 2 is a perspective view showing a barrel module 39a including the holding device 38. FIG. 3 is a plan view showing the barrel module 39a including the holding device 38. FIG. 4 is a cross-sectional view taken along line A-A of FIG. 3.

As shown in FIG. 2, the holding device 38 includes an annular frame member 41 and three supporting members 42 for holding the optical element 37. As shown in FIG. 3, the frame member 41 includes an inner ring 43, which functions as a holding member, an outer ring 44, displacement portions 70, parallel link portions 71, and transmission link portions 72.

The outer ring 44 includes a side wall portion 44a, which has an outer circumferential surface, and an annular flat plate portion 44b, which is arranged at the inner side of the side wall portion 44a. An annular fastening portion 40 is further arranged at the top and bottom ends of the side wall portion 44a.

The fastening portion 40 includes flat upper and lower fastening surfaces 40a. The upper fastening surface 40a has an annular groove 40b for accommodating an O-ring (refer to FIG. 4). Each fastening surface 40a has a plurality of bolt holes 40c formed at equiangular intervals. The O-ring is set in the annular groove 40b, and the upper fastening surface 40a is contacted with the lower fastening surface 40a of another barrel module 39a. Bolts are then inserted in the bolt holes 40c and fastened by nuts. In this way, the upper and lower fastening surfaces 40a are fastened together. The O-ring set in each of the plurality of barrel modules 39a ensures high gas sealing efficiency of the barrel modules 39a assembled together in the manner described above. Depending on a pressure difference between the inside and the outside of the barrel module 39a, the barrel module 39a may have a plurality of annular grooves 40b for accommodating a plurality of O-rings, or may use a different sealing member, such as a gasket, instead of an O-ring.

As shown in FIG. 3, three piezoelectric element drive portions 46 are arranged on the side wall portion 44a of the outer ring 44 at intervals of 120 degrees. Further, three sensor heads 47, which function as monitoring portions, are arranged on the side wall portion 44a at positions respectively deviated from the three piezoelectric element drive portions 46 by a distance corresponding to 60 degrees. An area of the side wall portion 44a excluding the areas in which the piezoelectric element drive portions 46 and the sensor heads 47 are arranged is formed as a closed surface. This structure improves the gas sealing efficiency of the outer ring 44.

The frame member 41 will now be described. The frame member 41 is formed by machining a metal material, such as stainless steel, using slit machining techniques or engraving machining techniques with a cutter, a drill, an end mill, laser processing, or electric discharge processing. The metal material is first cut into a disk shape material, and the cut disk shape material is machined to have a thickness that does not cause interference with the optical element 37. A circular hole is then formed in the central vicinity of the disk shape material. The disk shape material is then partially cut to conform to the shape of the inner ring 43. Afterwards, the displacement portions 70, the parallel link portions 71, and the transmission link portions 72 are formed using cutting and separating techniques, such as planer slit processing or three-dimensional engraving machining. The portions 70, 71, and 72 are not completely separated, but are connected to one another by connecting portions (LPU, LPL, and EH1 to EH4). The connecting portions are flexible, and enable the portions 70, 71, and 72 to be tiltable in a predetermined direction. The inner ring 43, the outer ring 44, the displacement portions 70, the parallel link portions 71, and the transmission link portions 72 are formed integrally from the same material. The relative positions of these portions are determined with high precision, and each of these portions is free form unnecessary stress. In this case, the expanding and contracting stroke of each piezoelectric element 65 is increased with a superior linearity and converted into the displacement of the inner ring 43.

The inner ring 43, the outer ring 44, the displacement portions 70, the parallel link portions 71, and the transmission link portions 72 will now be described with reference to FIG. 5.

Figure 5:
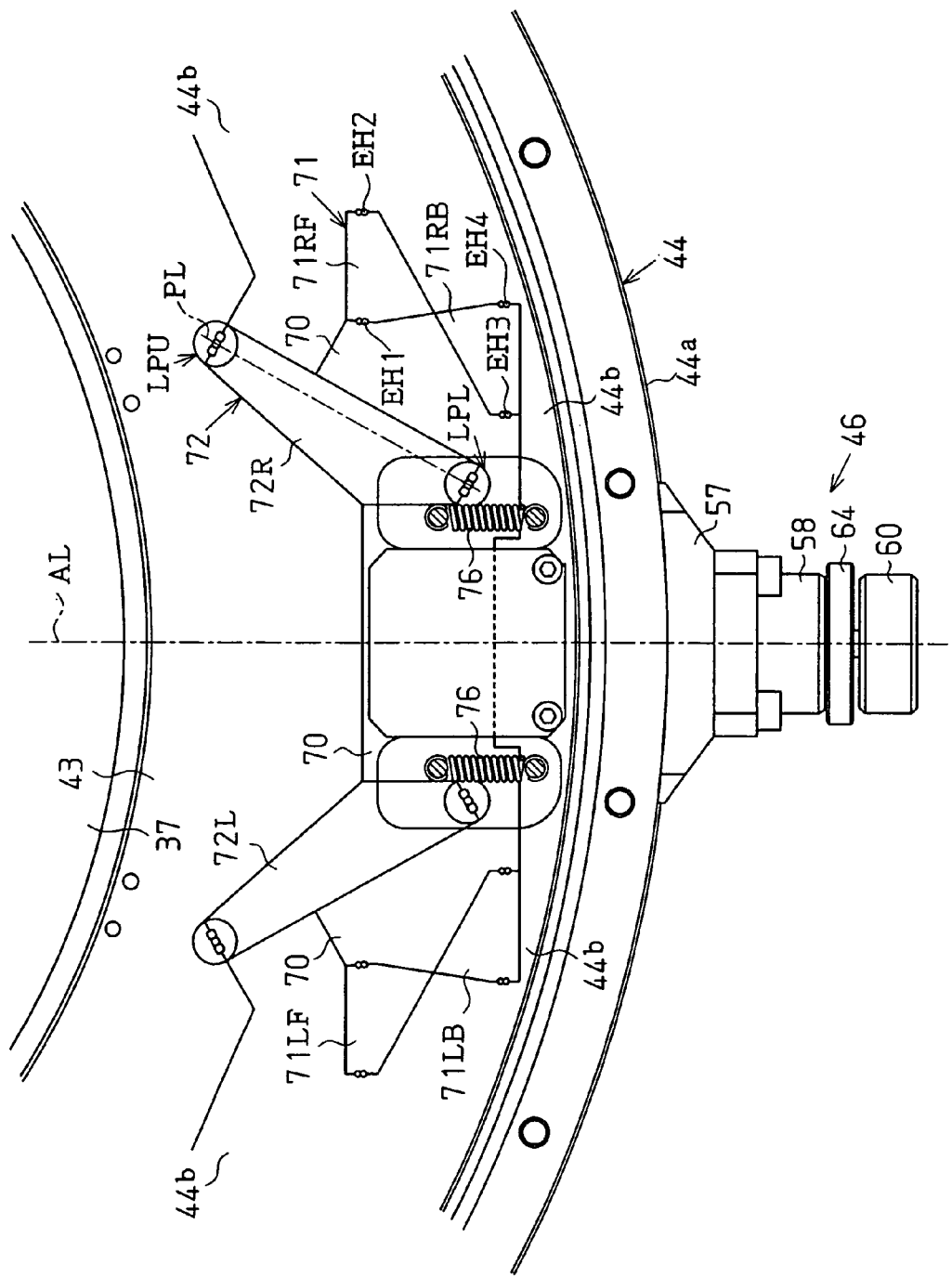
FIG. 5 is a partially enlarged plan view of FIG. 3.

The displacement portion 70 is arranged in the vicinity of the piezoelectric element drive portion 46 as shown in FIG. 5.

The parallel link portion 71 functions to guide the displacement portion 70. More specifically, the set of parallel link portions 71 arranged on opposite sides of the displacement portion 70 guides the displacement portion 70. The direction in which the displacement portion 70 is displaced is restricted with precision by the set of parallel link portions 71. The parallel link portions 71 will now be described in detail. The parallel link portions 71 include a right inner link 71RF and a right outer link 71RB, which are arranged at the right of the displacement portion 70, and a left inner link 71LF and a left outer link 71LB, which are arranged at the left of the displacement portion 70 as viewed in FIG. 5.

The right inner link 71RF is connected to the displacement portion 70 by an elastic hinge EH1 and connected to the flat plate portion 44b of the outer ring 44 by an elastic hinge EH2. The elastic hinges EH1 and EH2 have axes substantially parallel to the optical axis AX. The right inner link 71RF rotates about the elastic hinge EH1 and tilts with respect to the displacement portion 70. The right inner link 71RF rotates about the elastic hinge EH2 and tilts with respect to the flat plate portion 44b. The elastic hinge EH1 and the elastic hinge EH2 are positioned in a manner that a plane including the axis of the elastic hinge EH1 and the axis of the elastic hinge EH2 is perpendicular to the direction in which the piezoelectric element drive portion 46 is driven.

The right outer link 71RB is connected to the displacement portion 70 by an elastic hinge EH3 and connected to the flat plate portion 44b by an elastic hinge EH4. The elastic hinges EH3 and EH4 have their axes substantially parallel to the optical axis AX. The right outer link 71RB rotates about the elastic hinge EH3 and tilts with respect to the displacement portion 70. The right outer link 71RB rotates about the elastic hinge EH4 and tilts with respect to the flat plate portion 44b.

The elastic hinge EH3 and the elastic hinge EH4 are positioned in a manner that a plane including the axis of the elastic hinge EH3 and the axis of the elastic hinge EH4 is perpendicular to the direction in which the piezoelectric element drive portion 46 is driven.

Accordingly, the plane including the axes of the elastic hinge EH1 and the elastic hinge EH2 is parallel to the plane including the axes of the elastic hinge EH3 and the elastic hinge EH4. The plane including the axes of the elastic hinge EH1 and the elastic hinge EH3 is parallel to the plane including the axes of the elastic hinge EH2 and the elastic hinge EH4. A rectangular formed by connecting the axes of the elastic hinges EH1 to EH4 is a parallelogram.

The left inner link 71LF and the left outer link 71LB are symmetric to the right inner link 71RF and the right outer link 71RB with respect to a line of action AL, which coincides with the drive direction of the piezoelectric element drive portion 46. The functions of the left inner link 71LF and the left outer link 71LB are equivalent to the functions of the right inner link 71RF and the right outer link 71RB.

As a result, the parallel link portions 71 restrict the movement of the displacement portion 70 with respect to the flat plate portion 44b of the outer ring 44 in the direction perpendicular to the optical axis AX. In detail, with the left inner link 71LF and left outer link 71LB and the right inner link 71RF and right outer link 71RB being symmetric to each other with respect to the line of action AL, the interaction between the pair of parallel link portions 71 offsets a force that is applied orthogonally to the line of action AL. As a result, the displacement portion 70 is guided linearly with precision along the line of action AL, which is perpendicular to the optical axis AX.

The transmission link portions 72 function as transmission portions. Each set of transmission link portions 72 is formed by a set of push rods. The set of push rods is formed by a first rod 72R arranged at the right of the line of action AL and a second rod 72L arranged at the left of the line of action AL. Each of the rods 72R and 72L includes an outer end portion closer to the side wall portion 44a and an inner end portion farther from the side wall portion 44a. As shown in FIG. 3, the rods 72R and 72L become closer to each other as the side wall portion 44a becomes near. The outer end portion of the first rod 72R is connected to the displacement portion 70 by an outer rod pivot LPL. The inner end portion of the first rod 72R is connected to the inner ring 43 by an inner rod pivot LPU. The outer rod pivot LPL and the inner rod pivot LPU are formed integrally with the displacement portion 70 and the inner ring 43 by combining slit machining with engraving machining, which engraves the upper and lower end surfaces of the structure. The upper and lower surfaces of the inner ring 43 are engraved so that the outer rod pivot LPL and the inner rod pivot LPU have the designed depths. This enables the three-dimensional first rod 72R to be formed.

The first rod 72R is tiltable and pivotal in any direction about each of the outer rod pivot LPL and the inner rod pivot LPU.

The outer rod pivot LPL and the inner rod pivot LPU have different depths from the front surface and the rear surface of the flat plate portion 44b. The inner rod pivot LPU is arranged to be higher than the outer rod pivot LPL. As a result, a line PL connecting the inner rod pivot LPU and the outer rod pivot LPL (the axis of the first rod 72R) has a predetermined angle of deviation (angle of elevation) in the displacement direction of the displacement portion 70. The second rod 72L is formed symmetric to the first rod 72R with respect to the line of action AL.

The operation of the transmission link portion 72 will now be described. The outer end portion of the transmission link portion 72, which is connected to the displacement portion 70 by the outer rod pivot LPL, is displaced linearly in the direction perpendicular to the optical axis AX. When the transmission link portion 72 is pressed by the displacement portion 70 in the direction perpendicular to the optical axis AX, the movement of the inner end portion (rod pivot LPU) of the transmission link portion 72 is restricted in the direction of the optical axis AX. The movement of the plurality of transmission link portions 72 causes the inner ring 43 to be kinematically driven. This will be described later.

Hereafter, the line PL connecting the outer rod pivot LPL and the inner rod pivot LPU may be referred to as the axis PL of the transmission link portions 72. An angle formed by the axis PL and a plane orthogonal to the optical axis AX is, for example, about 10 to 15 degrees. Thus, when the outer end portion of the transmission link portion 72 is pressed horizontally, the outer end portion of the transmission link portion 72 is displaced horizontally but the inner end portion of the transmission link portion 72 is displaced upward along the optical axis AX.

Further, a displacement amount (distance) by which the inner end portion of the transmission link portion 72 is displaced is larger than a displacement amount (distance) by which the outer end portion is displaced. In the present embodiment, the piezoelectric elements 65 are used as drive sources. Each piezoelectric element 65 responds quickly to an applied voltage, and expands and contracts by a stable stroke (displacement amount). Each piezoelectric element 65 also exhibits an extremely large driving force. Such piezoelectric elements 65 are suitable for controlling the positions and the attitudes of the optical elements 37. However, the expanding and contracting stroke of the piezoelectric element 65 is typically small. The expanding and contracting stroke of the piezoelectric element 65 needs to be increased. The deviation angle described above has the function of converting the expanding and contracting direction of the piezoelectric element 65, and the function of increasing the expanding and contracting stroke of the piezoelectric element 65 to a sufficiently high level to control the position of the optical element 37.

As shown in FIG. 3, the optical element 37 is a lens, such as a circular convex lens or a circular concave lens. The optical element 37 is made of a glass material having a breaking strength of a predetermined value or higher, such as synthetic quartz or fluorite. As shown in FIG. 4, a flange portion 37a is formed on a peripheral edge of the optical element 37.

Figure 9:
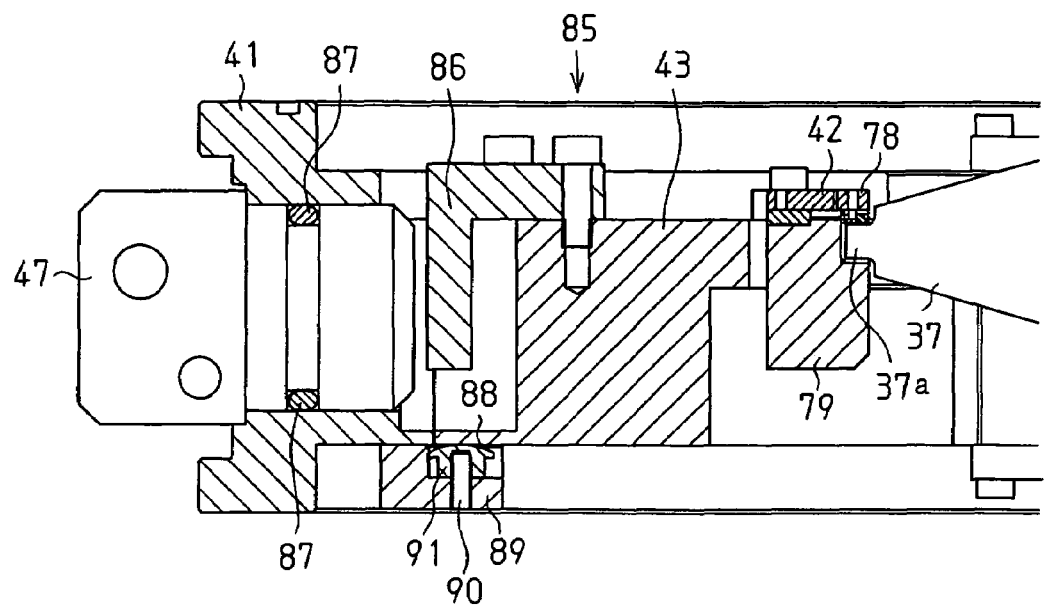
FIG. 9 is a partial cross-sectional view of FIG. 4.

The diameter of the optical element 37 is substantially the same as the inner diameter of the inner ring 43. As shown in FIG. 3, the three supporting members 42 are arranged at equiangular intervals along the inner circumference of the inner ring 43. The optical element 37 is supported by the three supporting members 42. As shown in FIG. 9, each supporting member 42 includes a base member 79 and a clamp member 78. The base member 79 and the clamp member 78 clamp the flange portion 37a of the optical element 37. The base member 79 includes a flexure structure for absorbing factors that would disturb the state of the optical surface of the optical element 37 (e.g., fine waves or distortions of the surface of the main body of the exposure apparatus 31 and the surface of the fastening portion 40 of the frame member 41). Such disturbance factors are given from an external device to the supporting members 42. Even when the flatness of the inner ring 43 changes due to external distortions transmitted through the frame member 41, such changes are absorbed by the supporting members 42 arranged between the optical element 37 and the inner ring 43. This structure prevents the optical element 37 from being subjected to stress or the optical surface of the optical element 37 from being subjected to disturbing factors.

The piezoelectric element drive portion 46, which functions as a fine movement mechanism, will now be described with reference to FIG. 6. The piezoelectric element drive portions 46 are mounted on the side wall portion 44a of the outer ring 44 (refer to FIG. 2). The side wall portion 44a has introduction holes 48, which are formed to extend toward the center (optical axis AX) of the outer ring 44.

A cylindrical piezoelectric element housing 54 is inserted through the introduction hole 48. The piezoelectric element housing 54 includes a bottom surface portion 55 and an annular flange 56 formed on an outer surface of a middle portion of the housing 54 in the longitudinal direction. A semispherical projection 57 is formed in the center of the bottom surface portion 55 of the piezoelectric element housing 54.

The flange 56 of the piezoelectric element housing 54 comes in contact with a drive portion 74, which is formed inside the displacement portion 70. The flange 56 is fixed by a fixing ring 75. The drive portion 74 accurately determines the relative positions of the piezoelectric element housing 54 and the displacement portion 70. The fixing ring 75, which is fixed to the displacement portion 70 by screws, prevents the relative positions of the drive portion 74 and the flange 56 from changing.

A sleeve-shaped seal house 49 is fitted in the introduction hole 48. More specifically, the seal house 49 is fixed to the side wall portion 44a. Annular grooves 50 and 51 are formed in the inner and outer surfaces of the seal house 49, respectively. An O-ring 52 is fitted in the annular groove 50. An O-ring 53 is fitted in the annular groove 51. The seal house 49, which has substantially the same inner diameter as the outer diameter of the piezoelectric element housing 54, is arranged between the inner wall surface of the introduction hole 48 and the outer circumferential surface of the seal house 49. The O-ring 52 ensures sealing between the piezoelectric element housing 54 and the seal house 49. The O-ring 53 ensures sealing between the seal house 49 and the introduction hole 48. The O-rings 52 and 53 also permit sliding between the piezoelectric element housing 54, the seal house 49, and the side wall portion 44a.

An annular pressing block 58 is fixed to the side wall portion 44a in the vicinity of the introduction hole 48 by screws. A piezoelectric element cap 59, which covers the opening of the pressing block 58, is fixed to the pressing block 58 by a screw (refer to FIG. 5). The piezoelectric element cap 59 has a screw hole that extends along the center line of the piezoelectric element housing 54. A rod portion 61 of a rough movement screw 60 is screwed into the screw hole and a lock nut 64. A semispherical projection 62, which faces toward the center of the outer ring 44, is formed on the distal end of the rod portion 61 of the rough movement screw 60. A head portion 63 of the rough movement screw 60 is disk-shaped. The lock nut 64 is fastened with the piezoelectric element cap 59 to fix the rough movement screw 60.

The piezoelectric element housing 54 accommodates the cylindrical piezoelectric element 65. The piezoelectric element 65 slightly expands and contracts in response to an applied voltage and displaces the displacement portion 70 with the drive portion 74. The piezoelectric element 65 includes a conical recess 66, which is formed in a central portion of the inner end surface closer to the optical axis AX, and a conical recess 67, which is formed in a central portion of the outer end surface farther from the optical axis AX. When the piezoelectric element 65 is accommodated in the piezoelectric element housing 54, the conical recess 66 is engaged with the semispherical projection 57. The rough movement screw 60 is screwed so that the conical recess 67 is engaged with the semispherical projection 62. A gap is formed between the piezoelectric element housing 54 and the piezoelectric element 65, so that the piezoelectric element 65 comes in contact with the piezoelectric element housing 54 only at its conical recess 66. A cap-shaped electrode 68 covers the outer end portion of the piezoelectric element 65. The piezoelectric element housing 54 and the electrode 68 are electrically insulated from each other. A driving voltage for driving the piezoelectric element 65 is supplied to the piezoelectric element drive portion 46 from a controller (not shown) via a cable (not shown).

The operation of each portion of the holding device performed when the piezoelectric element 65 is driven will now be described.

The position of the outer end surface of the piezoelectric element 65 is determined by the engagement between the conical recess 67 and the semispherical projection 62 of the rough movement screw 60. When the piezoelectric element 65 expands and contracts in this state, the piezoelectric element 65 urges the semispherical projection 57 of the piezoelectric element housing 54 toward the center of the outer ring 44. This causes the piezoelectric element housing 54 to move in the direction of the center (optical axis AX) of the outer ring 44. The flange 56 urges the displacement portion 70 in the direction of the optical axis AX. The displacement portion 70 is guided by the parallel link portion 71 (refer to FIG. 5) and is displaced in the direction perpendicular to the optical axis AX.

As shown in FIG. 5, a pair of return springs 76, which extend parallel to the line of action AL, connects the displacement portion 70 and the flat plate portion 44b of the outer ring 44. The return springs 76 are urging members, such as coil springs in an expanded state. The return springs 76 urge the displacement portion 70 toward the flat plate portion 44b of the outer ring 44, that is, in the direction that moves the displacement portion 70 away from the optical axis AX. When the supply of the driving voltage to the piezoelectric element 65 is stopped and consequently contracts the piezoelectric element 65, the return springs 76 urge the displacement portion 70 so that the displacement portion 70 is moved away from the optical axis AX until the semispherical projection 57 of the piezoelectric element housing 54 comes in contact with the conical recess 66.

The rough movement screw 60 is connected to the frame member 41 by the pressing block 58 and the piezoelectric element cap 59. When the head portion 63 of the rough movement screw 60 is turned, the rod portion 61 moves forward or backward relative to the piezoelectric element cap 59. As a result, the distance between the semispherical projection 62 and the optical axis AX changes so that the initial position of the outer end surface of the piezoelectric element 65 changes. This changes the initial positions of the piezoelectric element housing 54 and the displacement portion 70. In this way, the rough movement screw 60 is used to roughly adjust the distance between the displacement portion 70 and the optical axis AX.

Figure 6:
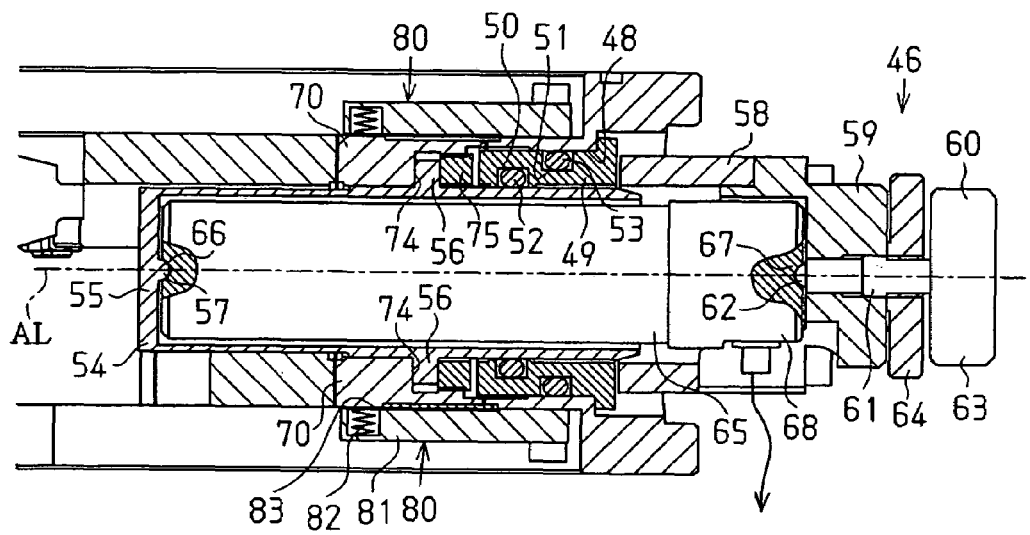
FIG. 6 is a partially enlarged view of FIG. 4.

As shown in FIG. 6, the flange 56 is an annular coupling portion arranged around the piezoelectric element housing 54. The drive portion 74 of the displacement portion 70 has an annular shape corresponding to the shape of the flange 56. The flange 56 and the drive portion 74 transmit the driving force of the piezoelectric element 65 uniformly to the displacement portion 70 along the line of action AL. The driving force is efficiently transmitted to the displacement portion 70 without generating forces that restrict the linear movement of the displacement portion 70.

The piezoelectric element 65 accommodated in the piezoelectric element housing 54 is fixed in a manner that its conical recess 67 is fixed to the semispherical projection 62 of the rough movement screw 60. A driving force generated by the piezoelectric element 65 is transmitted to the piezoelectric element housing 54 via the conical recess 66 and the semispherical projection 57 and to the displacement portion 70 via the flange 56. The semispherical projection 57 is arranged at a position closer to the optical axis AX than the flange 56, and the outer end surface of the piezoelectric element 65 is arranged outward from the side wall portion 44a of the outer ring 44. In the present embodiment, a piezoelectric element is not required to be arranged in the narrow area between the outer ring 44 and the displacement portion 70, and the piezoelectric element 65 may be arranged in a relatively large space. This enables a large piezoelectric element to be used as the piezoelectric element 65. The expanding and contracting stroke of the piezoelectric element 65 is elongated as the piezoelectric element 65 becomes longer. Although a piezoelectric element is typically a driving element of which the expanding and contracting stroke is small, the structure of the present embodiment enables the piezoelectric element to greatly displace the optical element 37 without increasing the size of the frame member 41. This further eliminates the need for increasing the size of the barrel and enables the driving elements, such as the piezoelectric elements 65, to be accommodated in the frame member 41.

In the structure of the present embodiment, sources that release chemical pollutants, such as actuators, electronic circuits, and cables, are not arranged in the inner space of the frame member 41 that communicates with the purge space. The piezoelectric element housing 54 (and the sensor head 47) isolates the inner space of the frame member 41 from the outside of the frame member 41. The piezoelectric elements 65 that are not arranged in the inner space of the frame member 41 are easily replaceable without disturbing the purge atmosphere. Further, by using the pressing block 58 and the piezoelectric element cap 59 in accordance with the size of the piezoelectric element 65, piezoelectric elements 65 of various sizes may be used. In this case, the size of the piezoelectric element 65 is changed without disturbing the purge atmosphere.

As shown in FIG. 6, a friction mechanism 80, which functions as a vibration attenuating mechanism, is arranged to sandwich the upper and lower surfaces of each displacement portion 70. The friction mechanism 80 includes a friction house 81, which is fixed to the flat plate portion 44b of the outer ring 44. The friction house 81 has a recess facing the displacement portion 70. The recess accommodates a coil spring (friction spring) 82, which is compressed. A friction applying plate 83 is arranged on the distal end of the friction spring 82. The friction applying plate 83 is a flat spring member having one end fixed to the friction house 81 and the other end being free. The friction spring 82 strongly urges the free end of the friction applying plate 83 toward the displacement portion 70. As a result, when the driving force of the piezoelectric element drive portion 46 causes the displacement portion 70 to move, a friction force for reducing the movement is generated. Although the friction force is not large enough to stop the movement of the displacement portion 70, the friction force is large enough to restrict drastic movement of the displacement portion 70. The friction mechanism 80 sandwiching the upper and lower surfaces of the displacement portion 70 prevents the generation of vibrations that would affect exposure.

The friction mechanism 80 applies friction force to the displacement portion 70. More specifically, before the transmission link portion 72 elongates the expanding and contracting stroke of the piezoelectric element 65, the friction mechanism 80 prevents vibration from being generated when the piezoelectric element drive portion 46 is driven. Thus, force or stress for reducing vibration is not directly applied to the transmission link portion 72 and the inner ring 43. Further, torque for displacing the displacement portion 70 is relatively large. Thus, the friction force of the friction mechanism 80 does not stop the displacement of the displacement portion 70. If a friction force for attenuating vibration is directly applied to the transmission link portion 72 or to the inner ring 43, the friction force may stop the displacement of the transmission link portion 72 or the inner ring 43.

Figure 7:
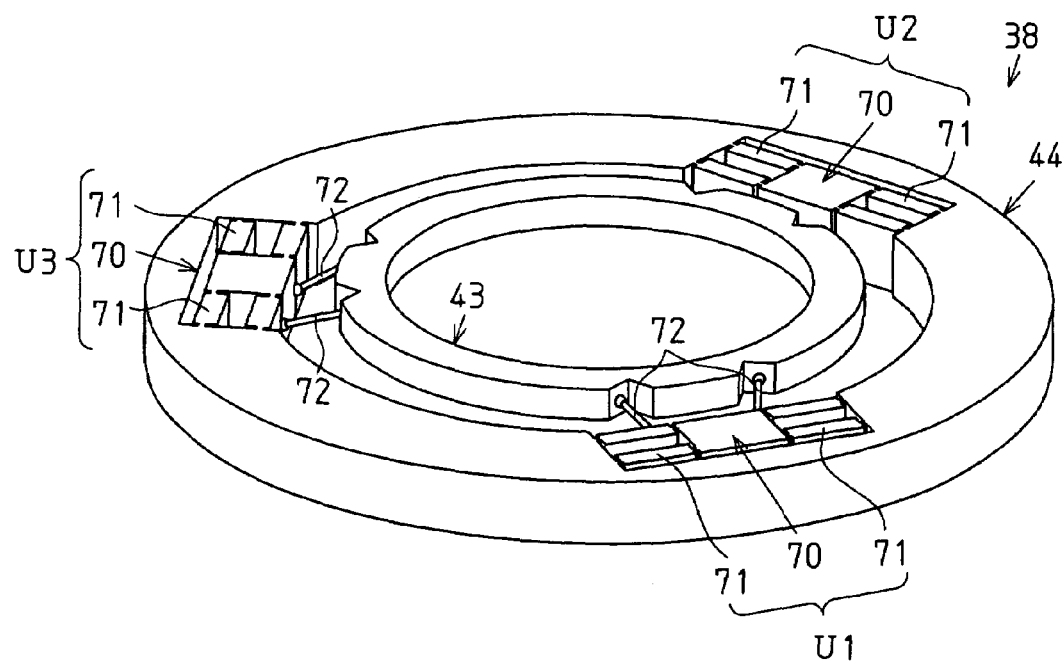
FIG. 7 is a schematic diagram of the optical element holding device according to the preferred embodiment.
Figure 8:
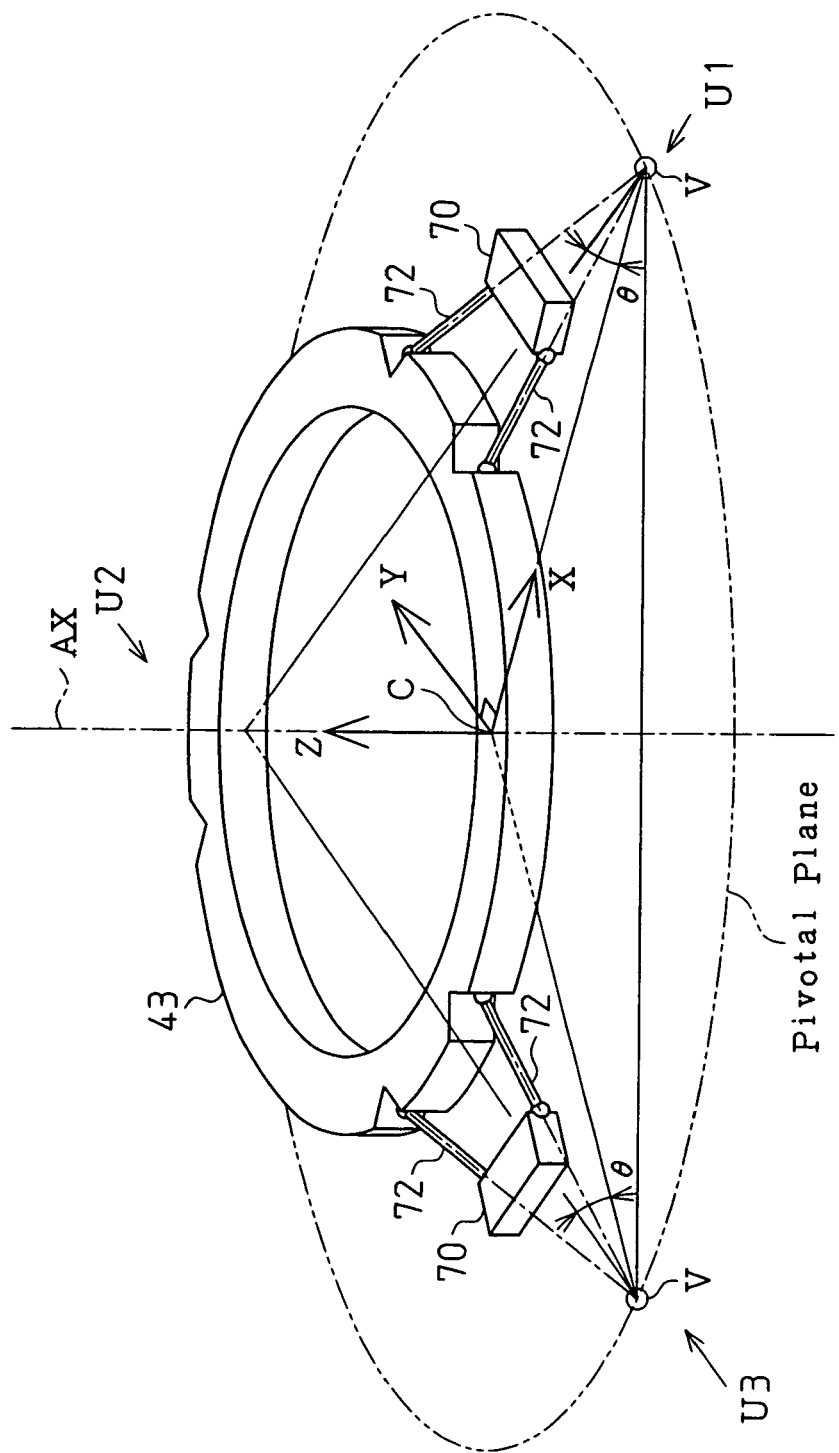
FIG. 8 is a schematic diagram of the optical element holding device according to the preferred embodiment.

The attitude control of the optical element 37 will now be described with reference to FIGS. 7 and 8. FIGS. 7 and 8 schematically show the holding device 38.

The three displacement portions 70 are arranged at equiangular intervals of 120 degrees. These drawings do not show the piezoelectric element drive portions 46. The parallel link portions 71 are arranged on opposite sides of each displacement portion 70. Each displacement portion 70 is connected to the inner ring 43 by a set of push rods, which form the transmission link portions 72. The interval between the two push rods increases as the inner ring 43 becomes closer. Each push rod tilts upward with respect to the horizontal plane. The displacement portions 70, the parallel link portions 71, and the transmission link portions 72 form three displacement link portions U1, U2, and U3.

FIG. 8 schematically shows only the inner ring 43, the displacement portions 70, and the transmission link portions 72.

The push rods in each set are symmetric to each other with respect to a plane including the optical axis AX. The displacement portions 70 are moved in the radial direction as shown in FIG. 8 to drive the inner ring 43. The quantitative relationship between the displacement amount of the displacement portion 70 and the attitude change of the inner ring 43 will now be described.

The terms used hereafter will be defined. As shown in FIG. 8, an intersection point of the extension lines of the two push rods in each of the displacement link portions U1, U2, and U3 is referred to as a virtual pivot V. A plane defined by the three virtual pivots V is referred to as a pivotal plane. The pivotal plane is orthogonal to the optical axis AX when the displacement portions 70 are not displaced. A center of a circle extending through the three virtual pivots V is referred to as an observation point C. It is apparent that the observation point C is on the pivotal plane. The observation point C is on the optical axis AX when the displacement portions 70 are not displaced.

A rectangular coordinate system will now be defined. The observation point C is used as an "origin" of the coordinate system when the displacement portions 70 are not displaced. As shown in FIG. 8, a line connecting the origin and the virtual pivot V of the first displacement link portion U1 is referred to as an X axis, an axis distant from the X axis by an angle of 90 degrees about the optical axis AX in the counterclockwise direction is referred to as a Y axis, and an axis orthogonal to the X axis and the Y axis is referred to as a Z axis. When the displacement link portions U1, U2, and U3 need to be distinguished from each other, symbols U1 to U3 will be added to the reference numerals, and will be referred to, for example, as transmission link portions 72U1 to 72U3, displacement portions 70U1 to 70U3, and virtual pivots VPU1 to VPU3.

The quantitative values related to the attitude change of the inner ring 43 occurring when the displacement portions 70 are displaced will be defined. When the attitude of the inner ring 43 is changed, the observation point C is displaced. The amounts by which the observation point C is displaced along the X, Y, and Z axes are referred to as displacement amounts dx, dy, and dz, respectively. The attitude change of the inner ring 43 for fine adjustment of the optical system is extremely small. Thus, the attitude change of the inner ring 43 may be divided linearly into the components of rotation amounts d$\theta$x, d$\theta$y, and d$\theta$z on the X axis, the Y axis, and the Z axis. The positive code of a value complies with the right hand screw rule with respect to the positive direction of the coordinate axes.

Among the six displacement amounts dx, dy, dz, d$\theta$x, d$\theta$y, and d$\theta$z for determining the attitude of the inner ring 43, the values of dx, dy, and d$\theta$z are apparently zero because of the structure. In other words, the inner ring 43 does not shift in the x direction and the Y direction, that is, in the horizontal direction, the displacement portions 70 are displaceable only in the radial direction (the direction of the line of action AL), and do not rotate about the Z axis.

As described above, the attitude change $\Delta$I of the inner ring 43 is expressed as shown below.

$$\Delta I = (dx, d\theta x, d\theta y)^T$$

In the present embodiment, the displacement of the displacement portion 70 that changes the attitude of the inner ring 43 is a linear movement along the line of action AL. Thus, the degree of freedom of the movement is expressed as 1. The displacement amounts of the three displacement portions 70U1 to 70U3 are respectively defined as $\delta$1, $\delta$2, and $\delta$3.

The displacement amounts of the displacement portions 70U1 to 70U3 may be expressed collectively as input displacement $\Delta p = (\delta 1, \delta 2, \delta 3)^T$.

The attitude change $\Delta$I corresponds linearly to the input displacement $\Delta$p, that is, corresponds in one-to-one to the input displacement $\Delta$p. This relationship is considered using a transformation matrix A (three by three) as a linear transformation of the expression shown below.

$$\Delta I = A \Delta p$$

Not only in the present embodiment but also in general cases, the transformation matrix A is easily formulated based on geometric considerations, and typically has an inverse matrix.

More specifically, the following is satisfied.

$$\Delta P = A^{-1} I$$

This indicates that the adjustment amount (the input displacement $\Delta$p) for achieving the attitude change $\Delta$I of desired optical elements from the viewpoint of the optical adjustment is obtained using a simple calculation.

The transformation matrix A of the present embodiment is expressed below.

$$A = (a, Ra, R^2 a)$$

$$a = (\tfrac{1}{3} \tan \theta, 0, \tfrac{2}{3} r \tan \theta)^T$$

Here, R is a rotation matrix at 120 degrees about the Z axis.

The transformation matrix A in the present embodiment is as described above. Appropriately setting $\theta$ or r optimizes the adjustment accuracy, the resolution, and the movable range.

In this way, the driving of the displacement portions 70 changes the attitude of the inner ring 43 via the transmission link portions 72.

The mechanisms described above are arranged inside the frame member 41.

As schematically shown in FIG. 7, the three displacement portions 70 of the outer ring 44 are connected to the three parallel link portions 71, respectively. Each displacement portion 70 is accurately guided by the relevant parallel link portions 71 and displaced linearly in the radial direction of the outer ring 44. The displacement of the displacement portions 70 is transmitted to the inner ring 43 by the transmission link portions 72 so as to change the attitude of the inner ring 43. In this way, the inner ring 43 is kinematically supported by the first to third displacement link portions U1 to U3. The basic idea of the present embodiment is to displace the displacement portions 70 so as to change the attitude of the inner ring 43.

Figure 10:
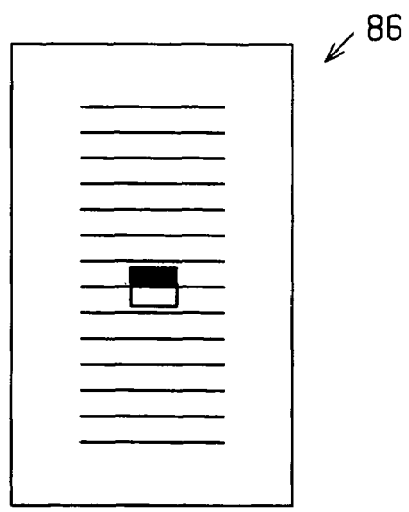
FIG. 10 is a front view showing a scale.

A displacement detecting mechanism will now be described with reference to FIGS. 9 and 10. The frame member 41 includes three sensor heads 47 and three detectors 85. The sensor heads 47 are arranged on the outer ring 44. The detectors 85 are arranged on the inner ring 43. Each detector 85 includes a scale 86, which is displaced together with the inner ring 43.

The scale 86 is mounted on the inner ring 43 in the vicinity of the sensor head 47. As shown in FIG. 10, the scale 86 includes a flat plate facing the sensor head 47. A lattice functioning as graduations for forming an incremental linear encoder and an origin lattice indicating an origin are displayed on the flat plate. The optical sensor head 47 reads a graduation on the scale 86 and detects displacement of the inner ring 43, that is, displacement of the optical element 37.

The sensor head 47 is hermetically fitted to the opening of the outer ring 44 with an O-ring 87 arranged therebetween. The sensor head 47 includes an objective lens (not shown) for reading a graduation on the scale 86, and an optical sensor portion (not shown) for generating a detection signal that is in accordance with the read graduation. The objective lens is formed hermetically so that the objective lens does not affect the purge atmosphere inside the barrel 39. In the preferred embodiment, the optical sensor portion provides the detection signal to an external controller. The controller increments a count number in accordance with the received detection signal and calculates a displacement amount. The sensor head 47 is formed in a manner that its portions excluding the lens portion at the distal end are not exposed in the purge space. More specifically, the electronic circuit, the sensor main body, and the cables of the sensor head 47 are not exposed in the purge space. In other words, the sources for releasing chemical pollutants are not arranged in the purge space. Thus, the purge atmosphere is prevented from being disturbed.

The inner ring 43 has a reference surface 88 in the vicinity of the scale 86. A datum house 89 is arranged at the side of the frame member 41 facing the reference surface 88. The datum house 89 accommodates a stud 90 and a spherical datum 91. The spherical datum 91 is mounted on the head portion of the stud 90. The spherical datum 91 has a spherical surface facing the inner ring 43. The spherical datum 91 and the stud 90 determine a reference position of the inner ring 43. More specifically, the inner ring 43 comes in contact with the spherical datum 91 when the inner ring 43 is at the lowest reference position. If the inner ring 43 is not in contact with the spherical datum 91, the inner ring 43 is lowered. To lower the inner ring 43, the displacement portion 70 is displaced in the direction in which the displacement portion 70 moves away from the optical axis AX by loosening, as a general rule, the rough movement screw 60 of the neighboring piezoelectric element drive portion 46. Play may exist between the conical recesses 66 and 67 at both ends of the piezoelectric element 65 and the semispherical projection 57 of the piezoelectric element housing 54 or the spherical projection 62 of the rough movement screw 60 when the inner ring 43 is in contact with the spherical datum 91. In this case, the displacement portion 70 is displaced in the direction in which the displacement portion 70 moves toward the optical axis AX by loosening, as a general rule, the rough movement screw 60 of the neighboring piezoelectric element drive portion 46 to a degree at which the inner ring 43 is not spaced from the spherical datum 91.

The exposure apparatus 31 shown in FIG. 1 includes the barrel 39, which is formed by the barrel modules 39a including the holding devices 38. As one example, the exposure apparatus 31 is manufactured in the manner described below.

First, at least one of the plurality of optical elements 37 including lenses and mirrors forming the illumination optical system 33 and the projection optical system 35 is held using the holding device 38. The illumination optical system 33 and the projection optical system 35 are incorporated in the main body of the exposure apparatus 31, and their optical adjustment is performed. Cables for transmitting detection signals and drive signals are connected to the piezoelectric element drive portions 46 and the sensor heads 47. The piezoelectric element drive portions 46 and the sensor heads 47 are connected by these cables to a known computer-controlled controller. The controller calculates displacement of the optical elements 37 based on detection signals provided from the sensor heads 47. The controller generates drive signals in accordance with the calculated displacement and the above expressions, and provides the piezoelectric element drive portions 46 with the drive signals. The piezoelectric element drive portions 46 are driven to change the attitudes of the optical elements 37.

Next, the wafer stage 36, which is formed by many mechanical parts, is mounted on the main body of the exposure apparatus 31 and wires are connected to the wafer stage 36. When the exposure apparatus is of a scanning type, the reticle stage 34 is also mounted. A gas supply pipe for supplying gas into the optical path of exposure light is connected, and the inner space of the barrel is purged. For example, the inner space of the barrel is filled with $N_2$ after $O_2$ and moisture are completely removed from the inner space of the barrel. After the wires and the pipe are connected, overall adjustment of the apparatus (including electricity adjustment and operation checking) is performed.

It is preferable that the components of the holding device 38 and the sealing members such as O-rings of the holding device 38 be assembled after those components are subjected to, for example, ultrasonic cleaning to remove impurities including working fluids and metallic substances, so that they do not release chemical pollutants. Further, it is preferable that the exposure apparatus 31 be manufactured in a clean room in which the temperature, humidity, atmospheric pressure, and cleanness are controlled.

In the preferred embodiment, fluorite and quartz are exemplified as the glass material for the optical element 37. Examples of the glass material for the optical element 37 may further include crystals of lithium fluoride, magnesium fluoride, strontium fluoride, lithium-calcium-aluminum-fluoride, and lithium-strontium-aluminum-fluoride. Further, modified quartz, such as fluoride glass made of zirconium-barium-lanthanum-aluminum, quartz glass doped with fluorine, quartz glass doped with fluorine and hydrogen, quartz glass containing OH group, and quartz glass containing fluorine and OH group, may also be used.

A device manufacturing method including a lithography process performed by the exposure apparatus 31 will now be described.

Figure 11:
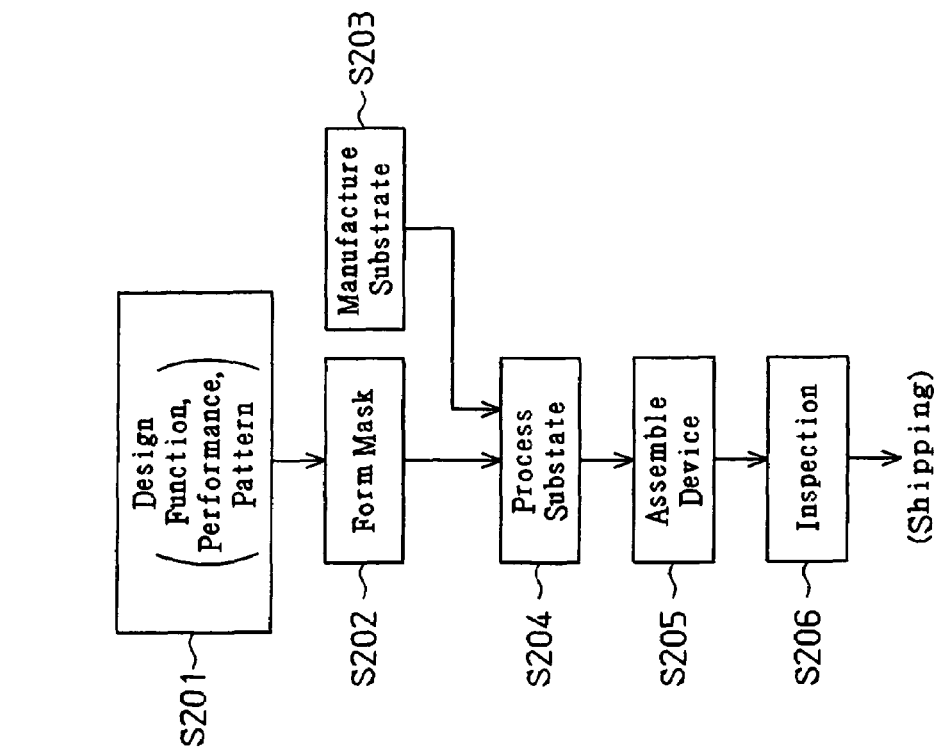
FIG. 11 is a flowchart schematically showing a device manufacturing method.

FIG. 11 is a flowchart showing the manufacturing processes of devices such as semiconductor devices including an IC and an LSI circuit, liquid crystal display devices, imaging devices (e.g., CCD), thin film magnetic heads, and micromachines. First, in step S201 (design step), the function and the performance of a device (microdevice) are designed (e.g., the circuit of a semiconductor device is designed), and a pattern for realizing the function is designed. In step S202 (mask forming step), a mask (e.g., a reticle Rt) having the designed circuit pattern is formed. In step S203 (substrate manufacturing step), a substrate is manufactured using a material such as silicon or a glass plate. The substrate may be, for example, a silicon wafer W.

In step S204 (substrate processing step), the mask and the substrate are used and an actual circuit is formed on the substrate by, for example, lithography. In step S205 (device assembling step), the substrate processed in step S204 is used and the device is assembled. Step S205 may include a dicing process, a bonding process, and a packaging process (including chip encapsulating).

In step S206 (inspection step), inspections including operation checking and durability testing of the device are performed. The device completed in this way is then shipped.

Figure 12:
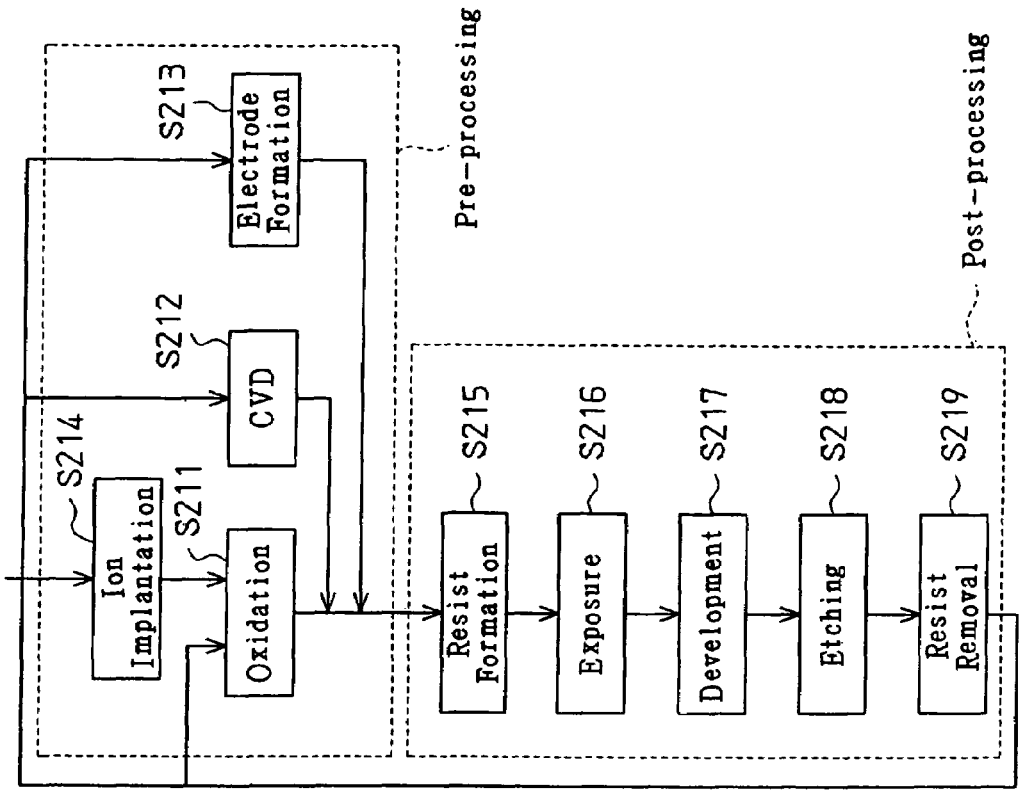
FIG. 12 is a flowchart showing part of a method for manufacturing a semiconductor device.

FIG. 12 is a detailed flowchart of step S204. When the device that is to be manufactured is a semiconductor device, the surface of the wafer W is oxidized in step S211 (oxidation step). In step S212 (CVD step), an insulation film is formed on the surface of the wafer W. In step S213 (electrode forming step), an electrode is formed on the wafer W by vapor deposition. In step S214 (ion implantation step), ions are implanted into the wafer W. Each of steps S211 to S214 is a pretreatment process in each stage of the wafer processing. Each of steps S211 to S214 is selectively executed according to a treatment process required in each stage of the wafer processing.

When the pretreatment processes described above are completed in the stages of the wafer processing, post treatment processes are performed in the manner described below. In step S215 (resist forming step), a photosensitizing agent is first applied to the wafer W. In step S216 (exposure step), a circuit pattern of a mask (reticle Rt) is transferred onto the wafer W using the lithography system (exposure apparatus 31) described above. In step S217 (development step), the waver W exposed is developed. In step S218 (etching step), portions of the exposure member excluding portions on which the resist is remaining are removed by etching. In step S219 (resist removing step), the resist that has become unnecessary after the etching is removed.

The pretreatment processes and the post treatment processes are performed repeatedly, so that a multiplex circuit pattern is formed on the wafer W.

The device manufacturing method according to the present embodiment uses the exposure apparatus 31 described above in its exposure process (step S216). The exposure light EL in a vacuum ultraviolet region enhances resolution. Further, the method controls the exposure amount with high precision. As a result, the method enables devices with a minimum line width of 0.1 µm to be manufactured at a high yield.

The present embodiment has the advantages described below.

(1) The piezoelectric element drive portions 46 and the sensor heads 47 are attached to the frame member 41. However, the outer ring 44 hermetically isolates the purge space from the outside. Further, sources for releasing chemical pollutants, such as sensors, actuators, and cables, are not arranged in the inner space of the frame member 41 that communicates with the purge space. Thus, even when an $F_2$ laser is used as a light source, the optical elements 37 are adjusted without disturbing the purge atmosphere.

(2) In the present embodiment, the driving force of the piezoelectric elements 65 mounted on the frame member 41 is transmitted to the inner ring 43 by the displacement portions 70 and the transmission link portions 72. This structure enables such drive sources to be arranged outside the frame member 41 and simplifies the internal structure of the frame member 41.

(3) The displacement portions 70 are displaced toward the optical axis AX within the plane orthogonal to the optical axis AX. The piezoelectric element drive portions 46 are accommodated within the thickness of the frame member 41. As a result, the holding device 38 is compact. The driving force is applied in parallel to the plane orthogonal to the optical axis AX. Thus, the frame member 41 is not distorted, the flatness of the holding device 38 is maintained, and the high sealing performance is maintained. Further, because this structure simplifies calculation required in the attitude control of the optical element 37, the attitude control is executed with high accuracy and high reliability.

(4) The inner ring 43 is kinematically supported by the three sets of push rods. Thus, the optical elements 37 are not subjected to stress and are held precisely at the controlled attitude.

(5) The piezoelectric elements 65 are accommodated in the piezoelectric element housing 54 arranged on the frame member 41. Thus, the piezoelectric elements 65 are replaceable from the outside of the frame member 41.

(6) The piezoelectric elements 65 are displaced quickly, strongly, and accurately in response to a driving voltage. Thus, the attitudes of the optical elements 37 are adjusted promptly and accurately.

(7) The piezoelectric element housing 54 and the transmission link portions 72 increase the expansion and contraction amount of the piezoelectric elements 65. Thus, the positions and the attitudes of the optical elements 37 are adjusted using the piezoelectric elements 65 that typically have small expansion and contraction amounts.

(8) The driving of the piezoelectric elements 65 is controlled by the controller. Thus, the positions and the attitudes of the optical elements 37 in the optical axis direction are adjusted automatically. Further, the rough movement screw 60 is manually operated from outside the holding device 38. Thus, the positions of the piezoelectric elements 65 are adjusted easily.

(9) The sensor head 47 for automatically detecting a graduation on the scale 86 may be combined with the controller so as to enable feedback control of the automatic adjustment of the optical element 37. The detector 85 uses the spherical datum 91 as a reference to accurately adjust the position of the optical element 37 with respect to the frame member 41. This structure improves the precision of the displacement detection.

(10) The return springs 76 cause the displacement portions 70 to return to their initial positions when the displacement portions 70 are not receiving a driving force. In this case, no unnecessary stress is applied to the transmission link portions 72 or to the inner ring 43.

(11) The friction mechanism 80 having a simple structure attenuates vibrations during driving without applying unnecessary stress to the transmission link portions 72 or to the inner ring 43. The friction force of the friction mechanism 80 is adjustable by adjusting the intensity of the friction spring 82.

(12) The outer ring 44, the inner ring 43, the displacement portions 70, the parallel link portions 71, and the transmission link portions 72 are formed integrally as a single metallic structure through, for example, engraving machining. The relative positions of these portions are accurate, and these portions are not subjected to unnecessary stress. As a result, the linearity of the attitude control of the optical elements 37 is high.

(13) Each barrel module 39a is joined with another barrel module 39b using the annular groove 40b formed in the fastening portion 40 so that the barrel 39 has high gas sealing efficiency.

(14) The exposure apparatus 31 including the barrel 39 having high gas sealing efficiency eliminates the need for a cover for maintaining the high-level purge atmosphere formed inside the barrel. As a result, when signals are provided as feedbacks from the sensor heads 47 using the optical elements 37 and the controller, the piezoelectric element drive portions 46 adjust the positions and the attitudes of the optical elements 37 while maintaining the high-level purge atmosphere.

(15) The exposure apparatus 31 enables highly accurate semiconductor devices to be manufactured at a high yield using an $F_2$ laser while maintaining the high-level purge atmosphere.

The preferred embodiment may be modified in the following forms.

The drive elements are not limited to the piezoelectric elements and may be other drive elements, such as solenoids, hydraulic actuators, and linear motors.

Depending on the structures of the actuator and the optical elements 37, the drive amount of the drive elements may be reduced instead of elongating the expanding and contracting stroke of the piezoelectric elements 65.

The displacement portions 70 are displaced within the plane perpendicular to the optical axis AX. Alternatively, the displacement portions 70 may be displaced in another direction intersecting with the optical axis AX.

The displacement portions 70 and the transmission link portions 72 do not have to be arranged at equiangular intervals.

Four or more transmission link portions may be arranged when the rigidity of the structure needs to be increased.

Although the transmission link portions 72 are arranged to intersect at the pivotal plane when the displacement portions 70 are not receiving a driving force, the present invention should not be limited to this structure.

Further, although the transmission link portions 72 are arranged symmetric with respect to the line of action AL, the transmission link portions 72 may be arranged in an asymmetric manner.

The transmission link portions 72 do not need to have the same length and same angle.

Although it is preferable to kinematically support the optical elements in a strict sense as in the preferred embodiment, the optical elements do not have to be supported completely kinematically as long as such supporting does not hinder the present invention.

In the preferred embodiment, the kinematically supporting structure is anomalistic and restricts three of the six degrees of freedom. However, the kinematically supporting structure may have higher degrees of freedom as long as such a structure applies a driving force in the direction intersecting with the optical axis AX of the optical elements 37.

Although the parallel link portions 71 are exemplified as guide portions in the preferred embodiment, other guide portions may be used. For example, the guide portions may slide the displacement portions to restrict the movement of the displacement portions at their inside or outside.

Although the sensor head 47 reads the scale 86 inside the frame member 41 via the hermetically sealed lens in the preferred embodiment, the outer ring 44 may have a hermetically sealed monitoring window. The displacement detection method should not be limited to the optical reading of the scale but may be one of various other detection methods including magnetic reading.

The present invention is not limited to the exposure apparatus using the projection optical system and may be applied to a contact exposure apparatus for exposing a pattern of a mask placed in contact with a substrate, or a proximity exposure apparatus for exposing a pattern of a mask placed in proximity of a substrate. Further, the projection optical system of the exposure system may not be dioptric but may be catadioptric.

The exposure apparatus of the present invention is not limited to the exposure apparatus that performs reduced projection exposure and may be, for example, an exposure apparatus that performs non-magnified projection exposure or an exposure apparatus that performs magnified projection exposure.

The present invention is applicable not only to microdevices such as semiconductor devices but also to exposure apparatuses for transferring a circuit pattern from a mother reticle to a glass substrate or to a silicon wafer for manufacturing a reticle or a mask used in light exposure apparatuses, EUV exposure apparatuses, X-ray exposure apparatuses, and electron beam exposure apparatuses. Exposure apparatuses using DUV (deep ultraviolet) light and VUV (vacuum ultraviolet) light typically use a transmissive reticle. Such exposure apparatuses typically use quartz glass, quartz glass doped with fluorine, fluorite, magnesium fluorine, or crystals as a material for a reticle substrate. Further, X-ray exposure apparatuses and electron beam exposure apparatuses of proximity type use a transmissive mask (a stencil mask or a membrane mask), and use, for example, a silicon wafer as a mask substrate.

The present invention is applicable not only to the exposure apparatus used for manufacturing semiconductor devices but also to an exposure apparatus for transferring a device pattern onto a glass plate in manufacturing displays including an LCD. The present invention is further applicable to an exposure apparatus used for transferring a device pattern onto a wafer, such as a ceramic wafer, when manufacturing thin film magnetic heads, or to an exposure apparatus used for manufacturing imaging devices including a CCD.

The present invention is applicable to a scanning stepper for transferring a pattern of a mask onto a substrate and moving a substrate in steps while the mask and the substrate are moved relative to each other. The present invention is further applicable to a step-and-repeat stepper for transferring a pattern of a mask onto a substrate and moving the substrate in steps in a state in which the mask and the substrate are still.

The light source for the exposure apparatus is not limited to an $F_2$ laser (157 nm) but may be an ArF excimer laser (193 nm), g-line (436 nm), i-line (365 nm), a KrF excimer laser (248 nm), a $Kr_2$ laser (146 nm), or an $Ar_2$ laser (126 nm). Harmonics obtained by amplifying single-wavelength laser light in an infrared region or a visible region that is oscillated from a DFB (distributed-feedback) semiconductor laser or a fiber laser using a fiber amplifier that is doped with, for example, erbium (or doped with erbium and ytterbium), and converting the wavelength of the light into ultraviolet light using a nonlinear optical crystal may be used.

The invention claimed is:

1. An optical element holding device for holding an optical element, the optical element holding device comprising:
   a frame member;
   a holding member arranged in the frame member and configured to hold the optical element;
   a displacement portion provided between the frame member and the holding member and configured to be displaced in a direction intersecting with an optical axis of the optical element by a driving force;
   a parallel link portion connected to the frame member and the displacement portion and configured to guide the displacement portion in the direction intersecting with an optical axis of the optical element; and
   a transmission portion, connected to the holding member and the displacement portion, and configured to transmit displacement of the displacement portion to the holding member, wherein the transmission portion displaces the holding member in a direction substantially parallel to the optical axis of the optical element.

2. The optical element holding device according to claim 1, wherein the displacement portion is displaced within a plane that is orthogonal to the optical axis of the optical element.

3. The optical element holding device according to claim 1, further comprising:
   a driving member attached to the frame member and configured to generate the driving force, wherein the driving member urges the displacement portion in a direction intersecting with the optical axis of the optical element.

4. The optical element holding device according to claim 1, further comprising:
   a driving member attached to the frame member and configured to generate the driving force, wherein the frame member is annular and has a center, and the driving member urges the displacement portion toward the center of the frame member.

5. The optical element holding device according to claim 3, wherein the driving member includes:
   a driving element; and
   a housing connected to the displacement portion and configured to accommodate the driving element.

6. The optical element holding device according to claim 5, wherein the housing includes a coupling portion configured to transmit a driving force generated by the driving element to the displacement portion.

7. The optical element holding apparatus according to claim 3, wherein the driving member includes a rough adjustment mechanism that roughly adjusts the position of the holding member, and a fine movement mechanism that finely adjusts the position of the holding member.

8. The optical element holding device according to claim 7, wherein the fine movement mechanism includes a piezoelectric element.

9. The optical element holding device according to claim 1, further comprising:
   an urging member arranged between the displacement portion and the frame member and configured to urge the displacement portion toward the frame member.

10. The optical element holding device according to claim 1, wherein the transmission portion is a rod having one end, connected to the holding member in a manner rotatable and tiltable in any direction, and another end, connected to the displacement portion in a manner rotatable and tiltable in any direction, with the one end and the other end of the rod being connected by an axis tilted relative to a direction in which the displacement portion is displaced.

11. The optical element holding device according to claim 10, wherein the displacement portion is one of three displacement portions that are arranged on the frame member, and the transmission portion is one of three transmission portions associated with the displacement portions, with each transmission portion including two rods connected to the associated displacement portion.

12. The optical element holding device according to claim 1, further comprising:
a vibration attenuating mechanism arranged between the frame member and the displacement portion and configured to attenuate vibration of the displacement portion generated by the driving force.

13. The optical element holding device according to claim 12, wherein the vibration attenuating mechanism includes a friction member fixed to one of the frame member and the displacement portion and slidably contacting the other one of the frame member and the displacement portion.

14. The optical element holding device according to claim 1, wherein at least two of the frame member, the displacement portion, the parallel link portion, and the transmission portion are monolithically formed as a single structure body.

15. The optical element holding device according to claim 14, wherein the single structure body is formed through engraving machining and includes a connecting portion connecting the at least two of the frame member, the displacement portion, the parallel link portion, and the transmission portion to one another.

16. The optical element holding device according to claim 15, wherein the connecting portion is formed by a plurality of connecting portions connecting in a relatively movable manner the frame member and the parallel link portion, the displacement portion and the parallel link portion, the displacement portion and the transmission portion, and the transmission portion and the holding member.

17. The optical element holding device according to claim 1, further comprising:
a displacement detection mechanism including a scale mounted on the holding member; and
a monitoring portion arranged on the frame member and configured to monitor a position of the scale.

18. The optical element holding device according to claim 17, wherein the monitoring portion reads the detection result while maintaining the frame member in an hermetically sealed state.

19. The optical element holding device according to claim 1, further comprising:
a seal configured to isolate an inner space of the frame member from the outer side of the frame member and to hermetically seal the inner space of the frame member.

20. A barrel comprising:
an optical element; and
the holding device according to claim 1 that holds the optical element.

21. The barrel according to claim 20, wherein the optical element is one of a plurality of optical elements constituting a projection optical system configured to project an image of a predetermined pattern formed on a mask onto a substrate.

22. An exposure apparatus for exposing an image of a predetermined pattern onto a substrate, the exposure apparatus comprising:
a mask on which the image of the predetermined pattern is formed; and
the barrel according to claim 21 that transfers the image onto the substrate.

23. A device manufacturing method comprising:
a lithography process including exposure performed with the exposure apparatus according to claim 22.

* * * * *